United States Patent
Seery et al.

(10) Patent No.: US 9,912,285 B2
(45) Date of Patent: *Mar. 6, 2018

(54) SOLAR PHOTOVOLTAIC MODULE CLAMPING SYSTEM

(71) Applicant: SolarCity Corporation, San Mateo, CA (US)

(72) Inventors: Martin Seery, San Rafael, CA (US); Tyrus Hawkes Hudson, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/295,973

(22) Filed: Oct. 17, 2016

(65) Prior Publication Data

US 2017/0033731 A1   Feb. 2, 2017

Related U.S. Application Data

(63) Continuation of application No. 14/592,594, filed on Jan. 8, 2015, now Pat. No. 9,473,065, which is a
(Continued)

(51) Int. Cl.
*H02N 6/00* (2006.01)
*H01L 31/042* (2014.01)
(Continued)

(52) U.S. Cl.
CPC .............. *H02S 20/23* (2014.12); *E04H 6/02* (2013.01); *F16M 13/02* (2013.01); *F24J 2/5232* (2013.01);
(Continued)

(58) Field of Classification Search
CPC .... F16B 2/02; F16B 2/06; F16B 2/065; F16B 5/06; F16B 5/067; H01L 31/042;
(Continued)

(56) References Cited

U.S. PATENT DOCUMENTS 730,203 A * 6/1903 Browning ............... B62B 17/02
248/137
2,903,929 A    9/1959 McVey
(Continued)

OTHER PUBLICATIONS

International Search Report dated Jul. 24, 2015 for International Patent Application No. PCT/US2015/029404, 3 pages.
(Continued)

*Primary Examiner* — Eli Mekhlin
(74) *Attorney, Agent, or Firm* — Kilpatrick Townsend & Stockton LLP

(57) ABSTRACT

A clamping system for securing the corners of four photovoltaic modules to a carport purlin, the clamping system having upper and lower body portions with an adjustable set screw between, the gap dimensioned to receive the purlin therein and the set screw rotatable to secure the purlin to the upper body portion. The system also having a pair of PV module connectors at opposite ends of the clamping assembly, each PV module connector adapted to secure a pair of PV modules to the purlin.

20 Claims, 16 Drawing Sheets

Related U.S. Application Data continuation of application No. 14/301,522, filed on Jun. 11, 2014, now Pat. No. 8,957,302.

(60) Provisional application No. 61/992,118, filed on May 12, 2014.

(51) Int. Cl.

| | | |
|---|---|---|
| *H02S 20/23* | (2014.01) | |
| *F16M 13/02* | (2006.01) | |
| *H01L 31/18* | (2006.01) | |
| *H02S 20/22* | (2014.01) | |
| *H02S 20/10* | (2014.01) | |
| *F24J 2/52* | (2006.01) | |
| *E04H 6/02* | (2006.01) | |
| *F24J 2/46* | (2006.01) | |

(52) U.S. Cl.
CPC ........... *F24J 2/5254* (2013.01); *F24J 2/5256* (2013.01); *F24J 2/5258* (2013.01); *H01L 31/18* (2013.01); *H02S 20/10* (2014.12); *H02S 20/22* (2014.12); *F24J 2002/4663* (2013.01); *F24J 2002/522* (2013.01); *Y02B 10/12* (2013.01); *Y02B 10/20* (2013.01); *Y02E 10/47* (2013.01); *Y10T 29/49828* (2015.01); *Y10T 29/49947* (2015.01); *Y10T 29/49948* (2015.01); *Y10T 29/49963* (2015.01)

(58) Field of Classification Search
CPC ... H01L 31/0422; H01L 31/0424; B25B 5/10; B25B 5/101; F24J 2/5211; F24J 2/5252; F24J 2/5256; F24J 2/5258
USPC .......... 248/276.1, 229.25, 241, 298.1, 309.1, 248/316.1, 316.7; 269/143, 249
See application file for complete search history.

(56) References Cited

U.S. PATENT DOCUMENTS

| | | | |
|---|---|---|---|
| 6,672,018 | B2 | 1/2004 | Shingleton |
| 7,557,292 | B2 | 7/2009 | Shingleton et al. |
| 7,592,537 | B1 | 9/2009 | West |
| 8,109,048 | B2 | 2/2012 | West et al. |
| 8,156,697 | B2 | 4/2012 | Miros et al. |
| 8,266,848 | B2 | 9/2012 | Seery et al. |
| 8,375,654 | B1 | 2/2013 | West et al. |
| 8,413,391 | B2 | 4/2013 | Seery et al. |
| 8,615,939 | B2 | 12/2013 | Seery et al. |
| 8,833,714 | B2 | 9/2014 | Haddock et al. |
| 8,925,263 | B2 | 1/2015 | Haddock et al. |
| 8,957,302 | B1 | 2/2015 | Hudson et al. |
| 8,991,114 | B2 | 3/2015 | West et al. |
| 9,193,014 | B2 | 11/2015 | Danning |
| 9,196,978 | B2 | 11/2015 | Magno |
| 2010/0089389 | A1 | 4/2010 | Seery et al. |
| 2010/0219304 | A1 | 9/2010 | Miros et al. |
| 2011/0100434 | A1 | 5/2011 | Van Walraven |
| 2012/0061337 | A1 | 3/2012 | Seery et al. |
| 2012/0090139 | A1* | 4/2012 | Scoggins .................. B25B 5/10 24/456 |
| 2012/0145228 | A1 | 6/2012 | Miros et al. |
| 2012/0267490 | A1 | 10/2012 | Haddock et al. |
| 2012/0298817 | A1 | 11/2012 | West et al. |
| 2013/0192150 | A1 | 8/2013 | Dupont et al. |
| 2013/0291472 | A1 | 11/2013 | Sader |
| 2013/0294814 | A1* | 11/2013 | Sader ..................... F24J 2/5205 403/21 |
| 2014/0053891 | A1 | 2/2014 | West et al. |
| 2015/0325738 | A1 | 11/2015 | Seery et al. |

OTHER PUBLICATIONS

Written Opinion dated Jul. 24, 2015 for International Patent Application No. PCT/US2015/029404, 7 pages.

\* cited by examiner

2

SOLAR PHOTOVOLTAIC MODULE CLAMPING SYSTEM

CROSS-REFERENCES TO RELATED APPLICATIONS

This application is a continuation of U.S. application Ser. No. 14/592,594, filed Jan. 8, 2015, now U.S. Pat. No. 9,473,065, issued Oct. 18, 2016, which is a continuation of U.S. application Ser. No. 14/301,522, filed Jun. 11, 2014, now U.S. Pat. No. 8,957,302, issued Feb. 17, 2015, which claims priority to U.S. Provisional Application No. 61/992,118, filed May 12, 2014, all of which are incorporated by reference herein.

TECHNICAL FIELD

The present invention relates generally to mounting systems for solar photovoltaic module arrays, and in particular to systems that mount photovoltaic modules onto carport purlins.

BACKGROUND OF THE INVENTION

Solar photovoltaic module arrays have been assembled onto building roofs for years. During installation, the installers typically work on the roof above the modules. However, a more recent trend has been to install solar photovoltaic module arrays such that they make up the "roof" of a carport. Such carport installations are becoming more common in business parking lots, especially in the southwestern United States. These solar carports offer the dual benefits of providing electricity generation, while also shading the cars parked below the solar module arrays.

Building these solar module array carports offer special challenges. First and foremost, there is no building "roof" on which the installers stand when assembling the module arrays. Instead, the modules themselves make up the "roof" of the structure. Therefore, carport solar module arrays are essentially assembled from below, with the individual modules being lifted above the operators and fastened onto the purlins/beams that support the modules.

Unfortunately, an ideal solution as to how to assemble a photovoltaic module array onto the purlins from below has proved to be a challenge. What is instead desired is a fast and simple system for fastening successive photovoltaic modules onto the purlins of the carport (such that the module array can be quickly and easily formed). Ideally, this new system would enable the installers to work from below the formed arrays as much as possible. As will be shown, the present invention provides such a system. In addition, the present system is not limited to carports. It can be used on various ground mount structures as well.

BRIEF SUMMARY OF THE INVENTION

The present invention provides a clamping assembly for securing the corners of four photovoltaic modules to a beam or purlin, comprising: (a) an upper body portion; (b) a lower body portion extending from the upper body portion so as to form a gap between the upper and lower body portions, the gap being dimensioned to receive a portion of a beam or purlin therein; (c) a rotating connector at each of the opposite ends of the upper body portion, each rotating connector having arms extending from opposite sides, wherein the arms are dimensioned to secure modules together, for example by locking into side grooves in a pair of adjacent photovoltaic modules; and (d) a fastener in the lower body portion, wherein the fastener adjusts the size of the gap between the upper and lower body portions into which the portion of the beam is received (so as to secure the clamping assembly onto the beam or purlin).

In preferred aspects, the beams or purlins form the structure of a carport, with the photovoltaic modules spanning between the purlins, forming the "roof" of the carport.

An advantage of the present clamping assembly is that it can be used to simultaneously hold together the corners of four different photovoltaic modules, with the tightening and locking functions/operations all being accessible from below the array.

Each of the rotating connectors fastens onto two photovoltaic modules. By having a rotatable connector at opposite ends of the clamping assembly, a single clamping assembly can be used to secure the corners of four different photovoltaic modules together. Preferably, each one of the rotating connectors have a pair of arms that can be rotated to a position where they lock into the side groove of a photovoltaic module. Thus, rotation of one connector secures two adjacent photovoltaic modules together. Preferably as well, the bottom ends of the rotating connectors are threaded and a nut is provided to tighten them into their final locked position. During installation, the operator first tightens the fastener in the lower body portion (to secure the clamping assembly onto the purlin/beam). Next, the installer positions the modules next to the clamping assembly and rotates the connectors such that they lock into side grooves in the modules.

One advantage of the present system is that it works with different beams and purlins of different shape. Another advantage of the present system is that it is easy to install and operate from below the array. Yet another advantage of the present system is that it allows for mid-module removal.

DETAILED DESCRIPTION OF THE INVENTION

Figure 1:
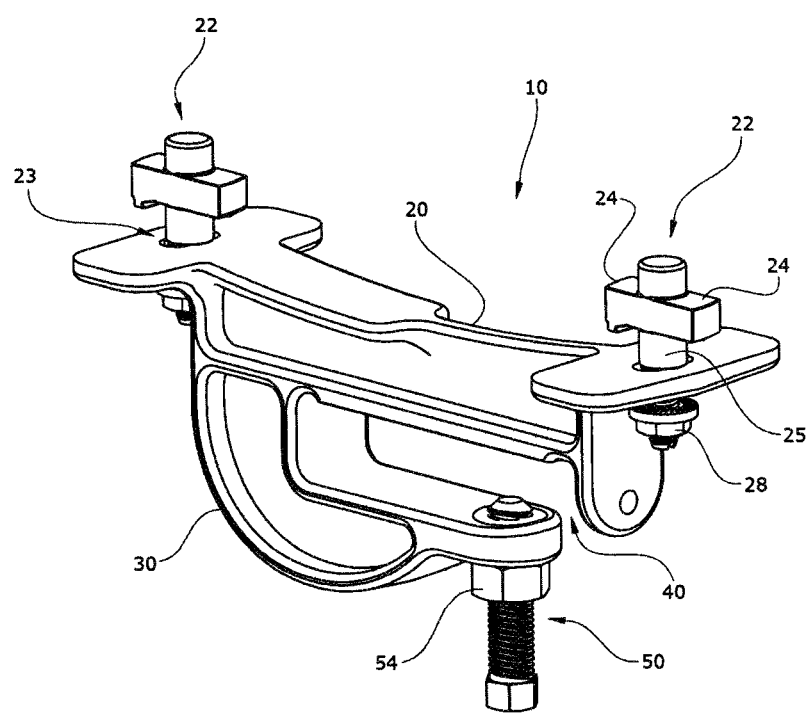
FIG. 1 is a first perspective view of the clamping assembly.
Figure 2:
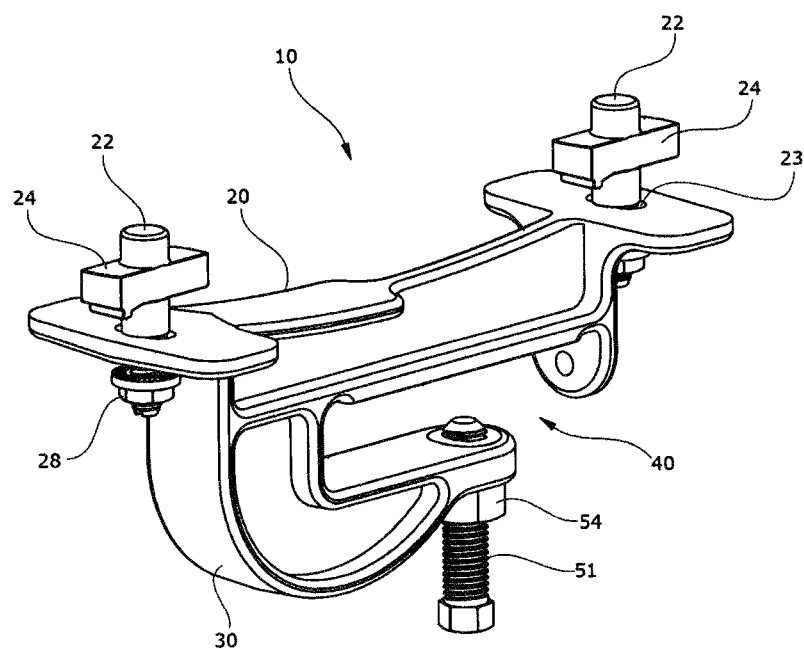
FIG. 2 is a second perspective view of the clamping assembly.
Figure 3:
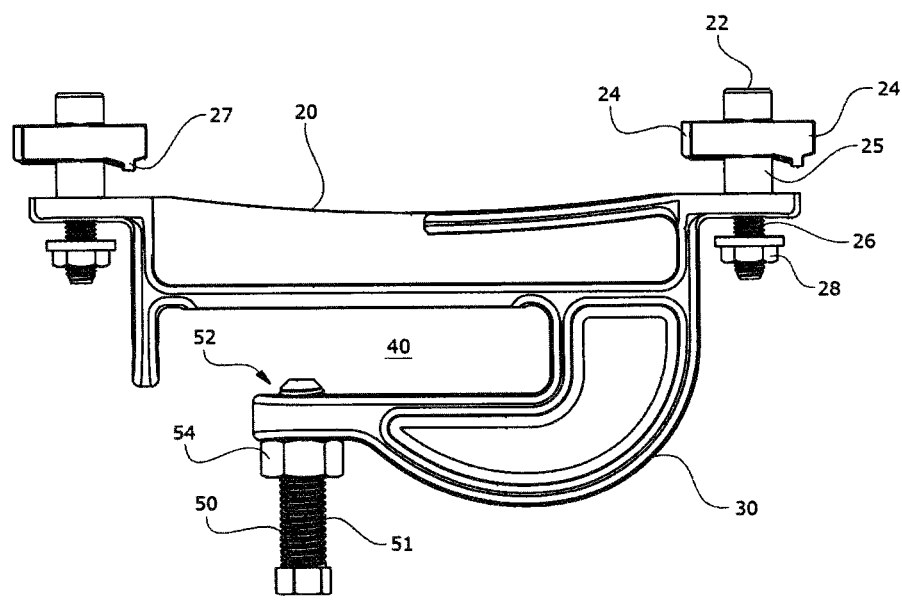
FIG. 3 is a side elevation view of the clamping assembly.
Figure 4:
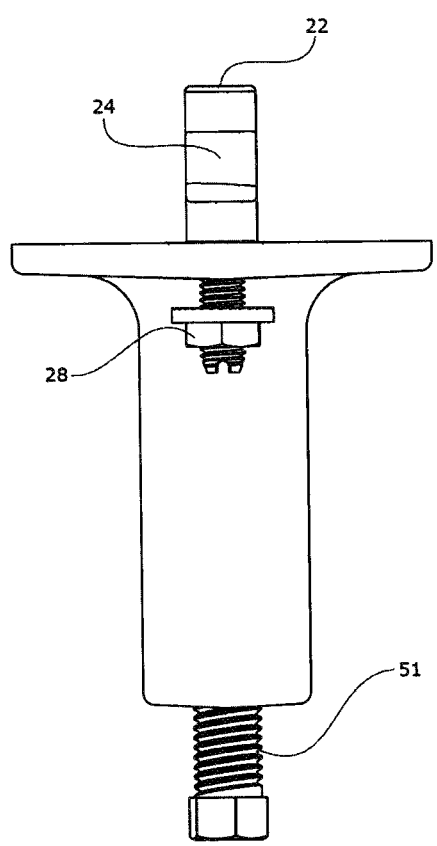
FIG. 4 is an end elevation view of the clamping assembly.
Figure 5:
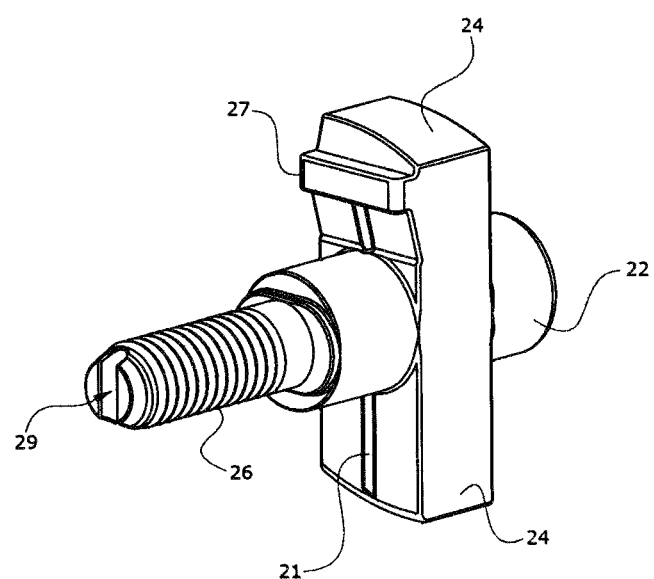
FIG. 5 is a bottom perspective view of one of the rotating connectors.
Figure 6:
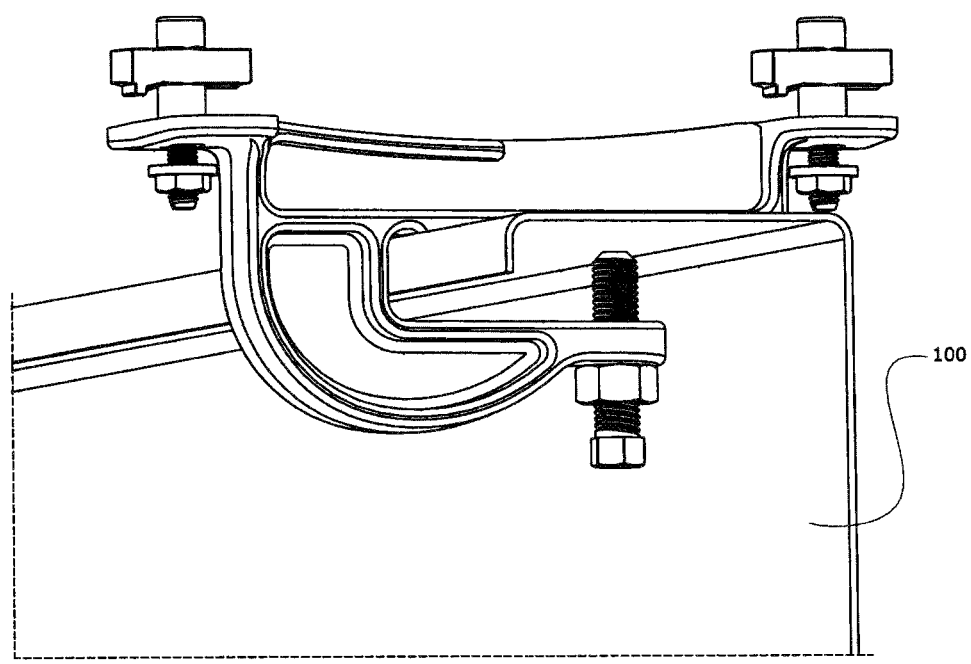
FIG. 6 is a perspective view of the clamping assembly attached onto a purlin.
Figure 7A:
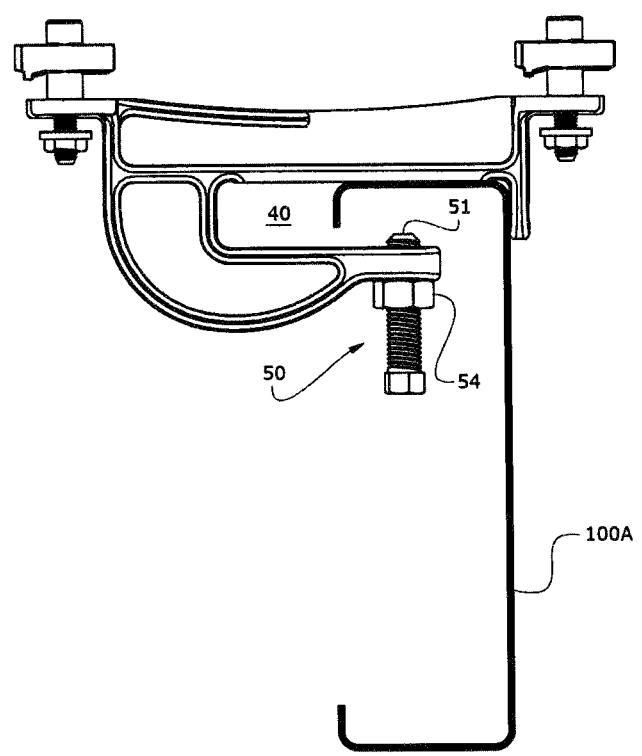
FIGS. 7A to 7C are side elevation view of the clamping assembly fastened to three different purlins.
Figure 7B:
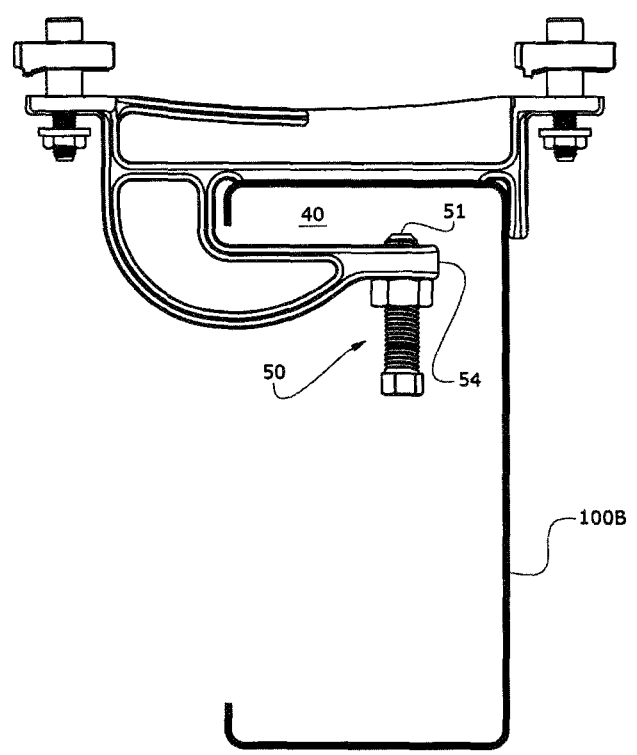
Figure 7C:
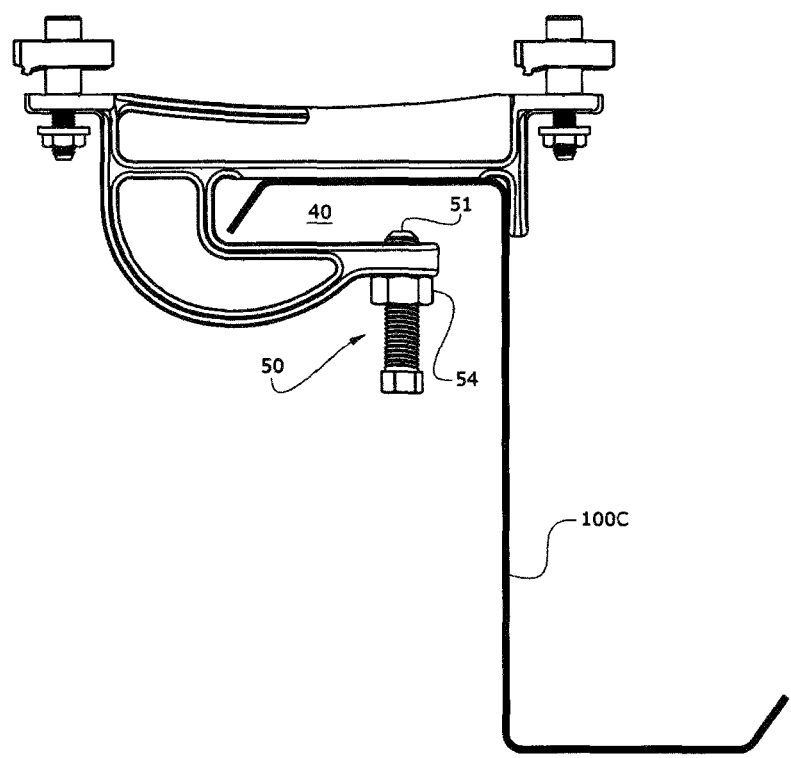
Figure 10:
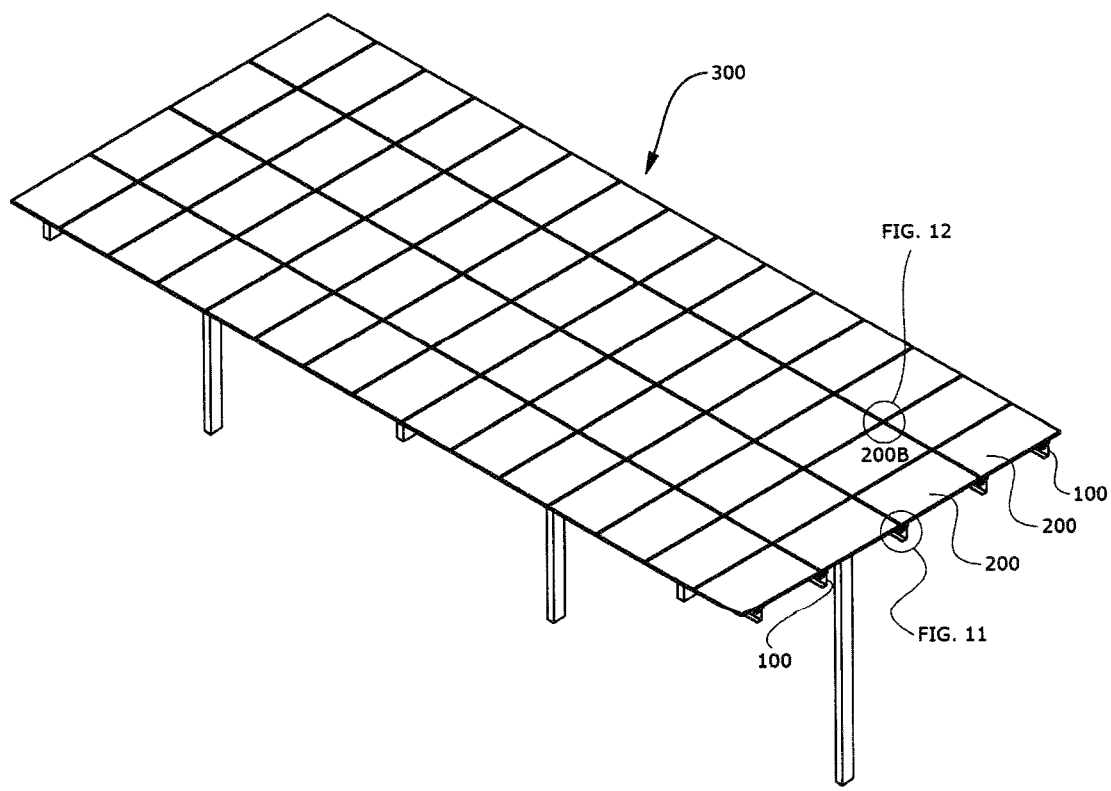
FIG. 10 is a perspective view of an assembled carport photovoltaic module array.
Figure 11:
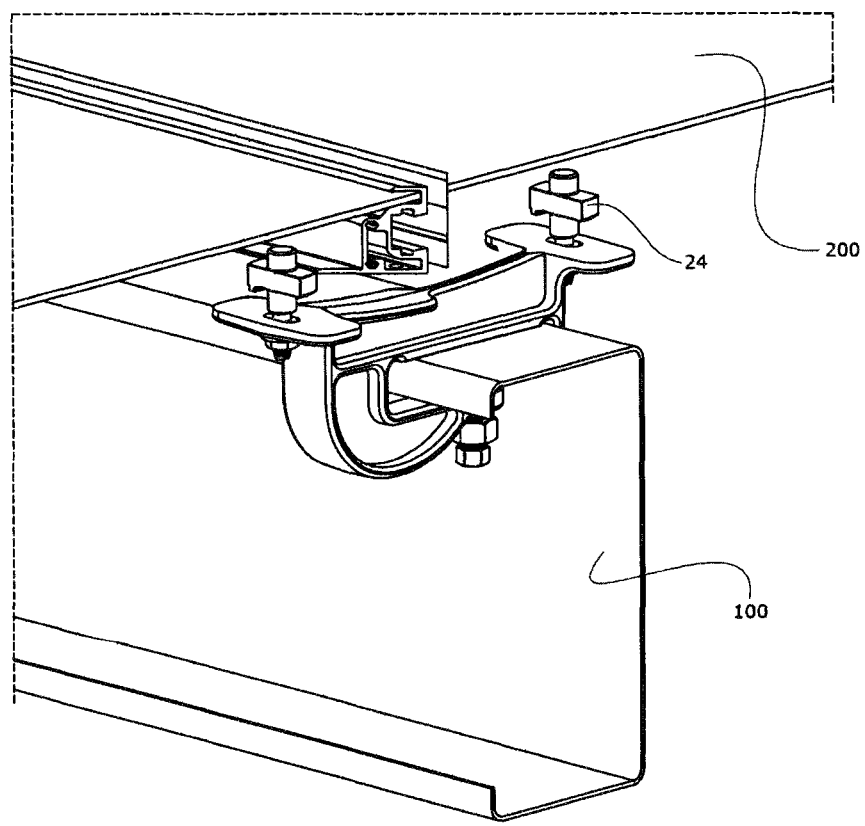
FIG. 11 is a close-up view of a portion of the assembled array seen in FIG. 10.
Figure 12:
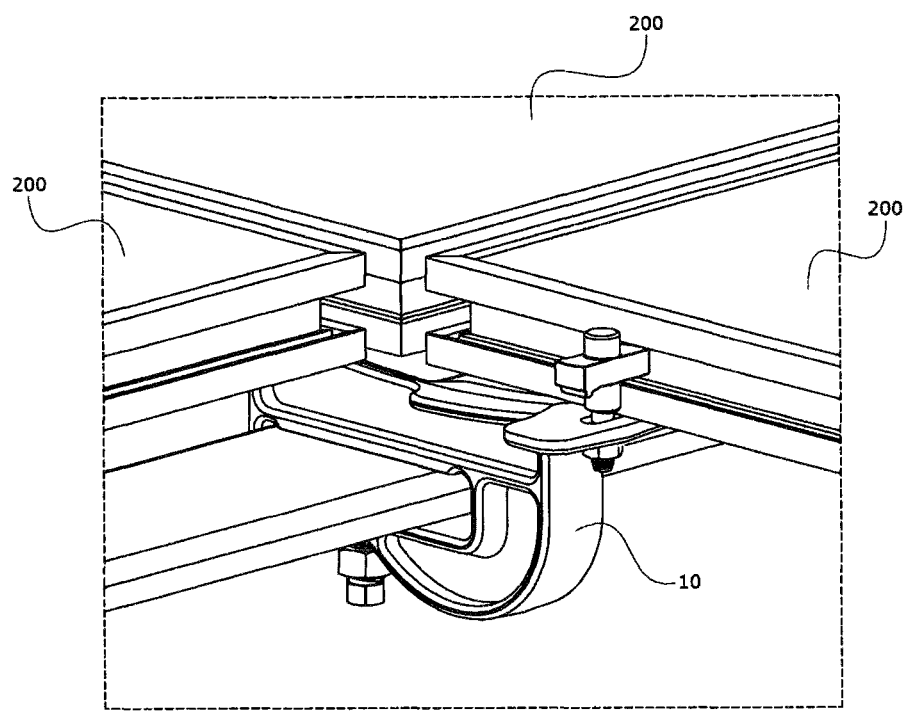
FIG. 12 is another close-up view of a portion of the assembled array seen in FIG. 10.

FIGS. 1 to 4 show different views of the clamping assembly. FIG. 5 shows further details of one of the rotating connectors of the clamping assembly. FIGS. 6 to 7C show the clamping assembly attached to a purlin. FIGS. 8A to 8D show the installation of a pair of photovoltaic modules onto one of the rotating connectors. FIGS. 9A to 9D show disengagement of one of the photovoltaic modules for removal/maintenance. FIGS. 10 to 12 show further details of an assembled carport photovoltaic module array.

Referring first to FIGS. 1 to 4, a clamping assembly 10 for securing photovoltaic modules to a beam or purlin is provided. Clamping assembly 10 comprises: an upper body portion 20; a lower body portion 30. Lower body portion 30 extends downwardly from upper body portion 20 so as to form a gap 40. Gap 40 is dimensioned to receive a portion of a beam/purlin 100 (see FIGS. 6 to 7C) therein.

Clamping assembly 10 also includes a pair of rotating connectors 22 at opposite ends of upper body portion 20. Each rotating connector 22 has a pair of arms 24 extending from its opposite sides. As will be shown, arms 24 are dimensioned to lock into side grooves in a pair of adjacent photovoltaic modules. Finally, clamping assembly 10 includes a fastener 50 in lower body portion 30. As shown, in embodiments, fastener 50 passes through lower body portion 30 and includes a fastener end positioned within gap 40. Fastener 50 is movable between a first position with the fastener end positioned proximate to lower body portion 30 side of gap 40, and a second position with the fastener end positioned proximate to upper body portion 20 side of gap 40. In the second position, the fastener end may be used to secure a portion of a beam or purlin, located within gap 40, against upper body portion 20. As can be seen, lower body portion 30 preferably extends from one side of upper body portion 20 so as to form a generally C-shaped clamping assembly.

Each rotating connector 22 is received through a hole 23 in an opposite end of upper body portion 20. In preferred embodiments, each rotating connector 22 comprises: an upper portion 25 from which arms 24 extend; a threaded bottom portion 26; and a nut 28 on threaded bottom portion 26. As can be seen, upper portion 25 is positioned above hole 23, threaded bottom portion 26 passes through hole 23 and nut 28 is positioned below hole 23.

In optional preferred embodiments, holes 23 are notched such that rotating connectors 22 sit with their arms 24 perpendicular to an axis passing through the center of both of the rotating connectors when nuts 28 on the threaded bottom portion are tightened. This positioning of rotating connectors 22 is seen in the installed views of FIGS. 11 and 12. In optional preferred embodiments, one of arms 24 of each of the rotating connectors 24 has a downwardly facing tooth 27 thereon.

In optional preferred embodiments, fastener 50 comprises a bolt 51 passing through a threaded hole 52 in lower body portion 30. Preferably, the head of bolt 51 is positioned below hole 52, as shown. Optionally, a torque nut 54 is received around bolt 51. As can be seen, the head of bolt 51 preferably has a smaller diameter than torque nut 54. The advantage of this is that an installer first tightens bolt 51 to secure the clamping assembly 10 to the carport purlin. Next, the installer tightens torque nut 54 over bolt 51. This securely fastens clamping assembly 10 to the carport purlin. Advantageously, since the diameter of the head of bolt 51 is smaller than the diameter of torque nut 54, the installer can use a tightening tool on torque nut 54 that simply slips over the smaller diameter of the head of bolt 51 (after bolt 51 has first been secured into position). Advantageously, both the tightening of bolt 51 and torque nut 54 can be done by the installer working below the array.

FIG. 5 shows further structural details of the rotating connector 22. For example, a slot 29 may be provided in the bottom of threaded portion 26. Slot 29 is ideally suited for mid-module removal (by reversing the locking steps described below). Specifically, an installer can insert a screwdriver into slot 29 and rotate connector 22 such that arms 24 can be rotated to lock into side grooves in a pair of photovoltaic modules. By having slot 29 at the bottom side of clamping assembly, it is accessible from underneath the array. Thus, the locking of arms 24 into the photovoltaic modules can be done while working below the array. In addition, an optional grounding rib 21 can be included. When rotated into its final locked position, the grounding rib 21 will cut into the anodized surface of the module, thereby providing a grounding module-to-module contact.

FIG. 6 shows clamping assembly 10 fastened onto the top of a purlin 100. FIGS. 7A to 7C show the versatility of the clamping system as it can be used to connect to purlins of different shapes and cross sections (e.g.: purlins 1OOA, 1OOB and 1OOC). After the top end of the purlin is inserted into gap 40, then fastener 50 is tightened (such that the top of bolt 51 is received against the inside of the purlin). Next, torque nut 54 is tightened, thereby preventing bolt 51 from loosening.

Figure 8A:
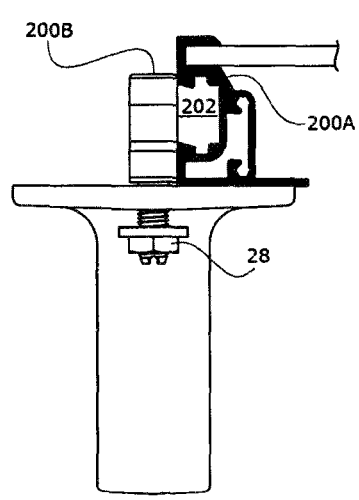
FIGS. 8A to 8D are successive end elevation views showing the installation of a pair of photovoltaic modules onto one of the rotating connectors.
Figure 8B:
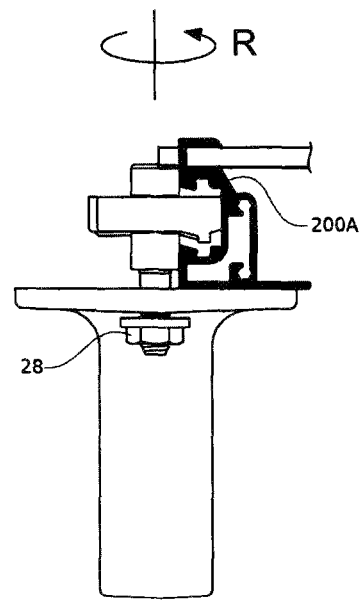
Figure 8C:
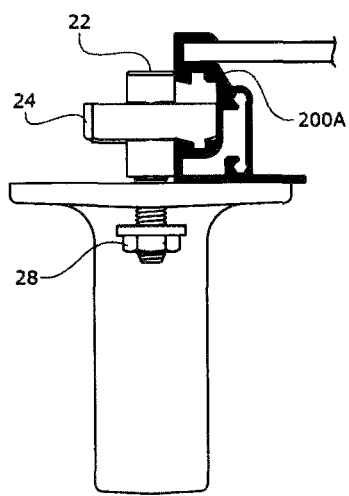
Figure 8D:
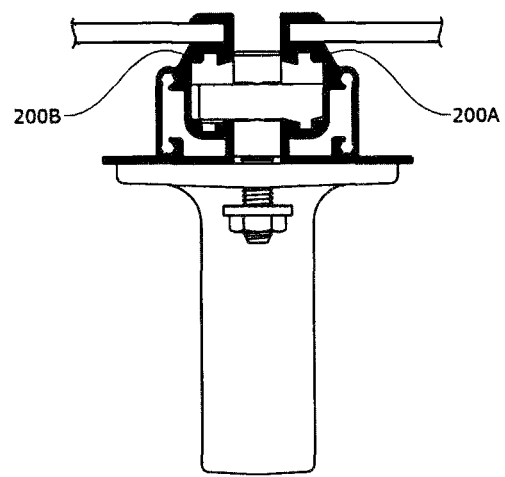

FIGS. 8A to 8D are successive end sectional elevation views showing the installation of a pair of photovoltaic modules onto one of the rotating connectors, as follows. First, as seen in FIG. 8A, the side edge of a photovoltaic module frame 200A is placed on top of upper portion 20 sitting adjacent to rotating connector 22. As can be seen, photovoltaic module frame 200A has a side groove 202 therein. Next, as seen in FIG. 8B, an installer pushes or pulls upwardly (preferably from below) on the bottom of rotating connector 22, lifting rotating connector 22, and then rotates rotating connector 22 by ninety degrees in direction R such that arm 24 is received into side groove 202 of frame 200A. Next, as seen in FIG. 8C, the installer lowers rotating connector 22 (such that tooth 27 fits down into a bottom portion of the side groove 202) and then partially tightens nut 28, thereby securing frame 200A into a locked position. (At this time, rotating connector 22 sits down into notch 23, preventing the connector from rotating). Finally, as is seen in FIG. 8D, the installer slips a second photovoltaic module frame 200B onto the "toothless" arm 24. Nut 28 can be further tightened as needed to secure photovoltaic module frames 200A and 200B onto clamping assembly 10. The advantage of having tooth 27 on only one of the pair of arms 24 is that the second module 200B can be removed if needed (by loosening nut 28). In addition, this allows for adjustment of the photovoltaic module on the side without the tooth, such that the module can be pulled out slightly for adjustment.

Figure 9A:
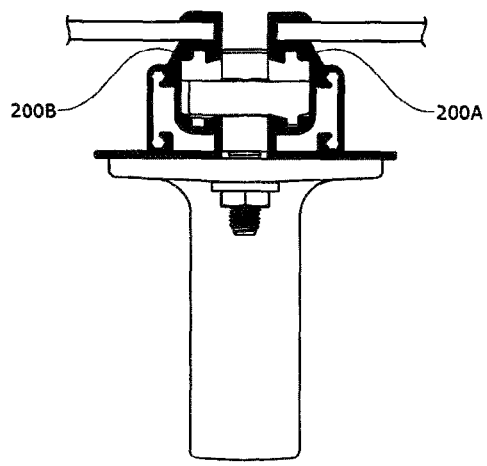
FIGS. 9A to 9D are successive end elevation views showing movement of the rotating connector to disengage the photovoltaic modules such that one of the modules can be removed for maintenance.
Figure 9B:
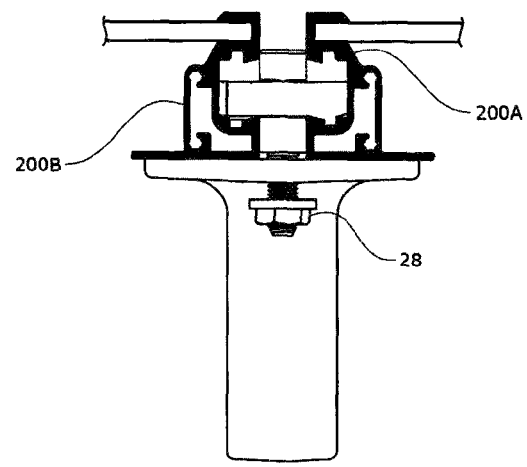
Figures 9C, 9D:
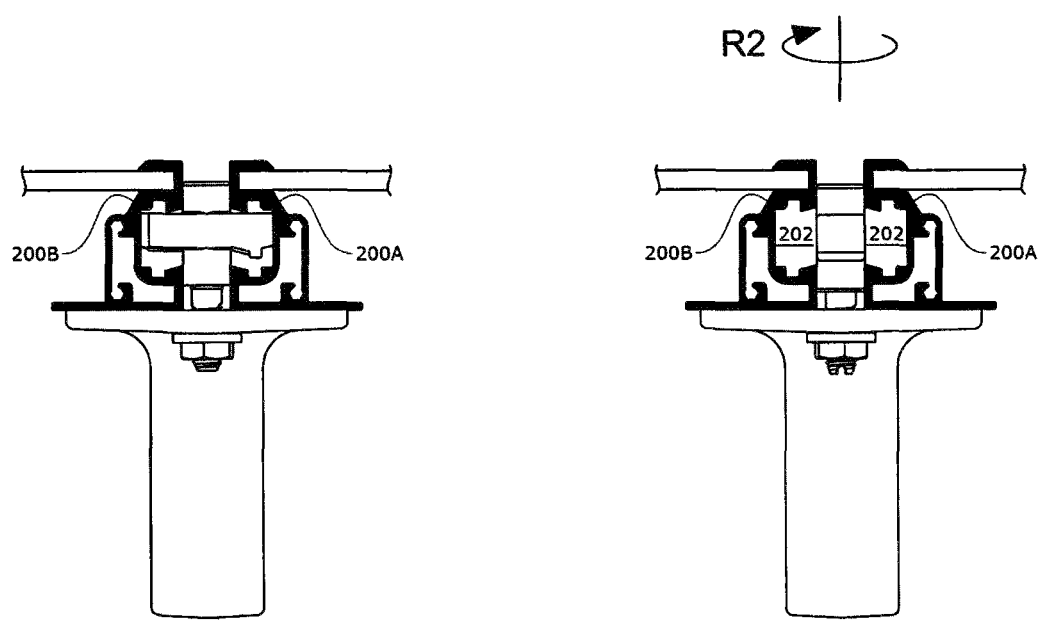

FIGS. 9A to 9D are successive end elevation views showing movement of the rotating connector to disengage the photovoltaic modules (e.g.: mid-array module 200B in FIG. 10) such that one of the modules can be removed for maintenance, as follows. FIG. 9A begins at the same point in time as FIG. 8D. Next, in FIG. 9B, the installer loosens nut 28. Next, in FIG. 9C, the installer pushes up on the bottom of bottom portion 26 (for example with the end of a screwdriver received into slot 29). Finally, in FIG. 9D, the installer rotates bottom portion 26 in direction R2 by ninety degrees such that arms 24 unlock from side grooves 202 in each of module frames 200A and 200B.

FIGS. 10 to 12 show an assembled carport photovoltaic module array according to the present system (FIG. 10), with close-up views of portions of the array (FIGS. 11 and 12).

An array 300 of photovoltaic modules 200 forms the "roof" of the carport. Array 300 thus is mounted onto purlins 100 by a plurality of clamping assemblies 10. FIG. 11 shows a view of an end of array 300. As can be seen, a single clamping assembly 10 holds the corners of two adjacent photovoltaic modules 200 together. FIG. 12 shows a view of four adjacent photovoltaic modules 200 (however, one of the photovoltaic modules 200B has been removed for clarity). As can be seen, the single clamping system 10 holds the four corner edges of the photovoltaic modules together, with each rotating connector 22 being positioned such that its arms 24 are rotated to lock into the side grooves 202 of the photovoltaic modules 200. As can also be seen, the four corners of the photovoltaic modules 200 are held together at a position over purlin 100.

What is claimed is:

1. A clamping assembly for securing photovoltaic modules to a beam, the clamping assembly comprising:
    an upper body portion having a first end and a second end, at opposite ends of a longitudinal axis of the upper body;
    a lower body portion connected to the upper body at the first end, and extending toward the second end forming a gap there between, the gap being dimensioned to receive a portion of a beam therein;
    a first connector mounted at the first end of the upper body portion, the first connector including first and second photovoltaic module connecting portions;
    a second connector mounted at the second end of the upper body portion, the second connector including third and fourth photovoltaic module connecting portions; and
    a fastener passing through the lower body portion and including a fastener end positioned within the gap, wherein the fastener is movable between a first position and a second position wherein the second position is closer to the upper body portion than the first position, and wherein the fastener is configured to secure the portion of the beam between the fastener end and the upper body portion.

2. The clamping assembly of claim 1, wherein the first and second photovoltaic module connecting portions on the first connector are configured to secure first and second photovoltaic modules to the beam, and the third and fourth photovoltaic module connecting portions on the second connector are configured to secure third and fourth photovoltaic modules to the beam.

3. The clamping assembly of claim 2, wherein the clamping assembly is configured to support corners of each of the first, second, third and fourth photovoltaic modules.

4. The clamping assembly of claim 1, wherein the first and second photovoltaic module connecting portions are located on opposite sides of the first connector, and the third and fourth photovoltaic module connecting portions are located on opposite sides of the second connector.

5. The clamping assembly of claim 1, wherein the first and second connectors are rotatable.

6. The clamping assembly of claim 1, wherein the first and second connectors and the fastener have threaded lower ends configured to receive tightening bolts.

7. The clamping assembly of claim 1, wherein the first and second connectors are configured to be rotated, from a position on a side of the lower body portion opposite the gap, to secure photovoltaic modules to the clamping assembly.

8. The clamping assembly of claim 1, wherein rotational orientations of the first and second connectors relative to the upper portion are adjustable from a position on a side of the lower body portion opposite the gap.

9. The clamping assembly of claim 1, wherein the first connector includes a grounding rib configured to ground a photovoltaic module secured to the clamping assembly.

10. The clamping assembly of claim 1, wherein the fastener includes a bolt passing through a threaded hole in the lower body portion, and wherein a head of the bolt is positioned on a side of the lower body portion opposite the gap.

11. The clamping assembly of claim 10, further comprising a torque nut received around the bolt, wherein the head of the bolt has a smaller diameter than the torque nut.

12. A solar carport comprising:
    a beam;
    a photovoltaic module positioned on a first side of the beam and forming a portion of a roof of the solar carport;
    a clamping assembly securing the photovoltaic module to the beam, the clamping assembly comprising:
        an upper body portion having a first end and a second end, at opposite ends of a longitudinal axis of the upper body;
        a lower body portion connected to the upper body at the first end, and extending toward the second end forming a gap there between, wherein a portion of the beam is positioned within the gap;
        a first connector mounted at the first end of the upper body portion, the first connector including first and second photovoltaic module connecting portions, wherein the first photovoltaic module connecting portion secures the photovoltaic module to the clamping assembly;
        a second connector mounted at the second end of the upper body portion, the second connector configured to secure additional photovoltaic modules to the clamping assembly; and
        a fastener passing through the lower body portion and including a fastener end positioned within the gap, wherein the fastener is movable between a first position and a second position wherein the second position is closer to the upper body portion than the first position, and wherein the fastener is configured to secure the portion of the beam between the fastener end and the upper body portion.

13. The solar carport of claim 12, further comprising:
    a second photovoltaic module,
    wherein the second photovoltaic module connecting portion secures the second photovoltaic module to the clamping assembly.

14. The solar carport of claim 13, further comprising:
    third and fourth photovoltaic modules,
    wherein the second connector includes third and fourth photovoltaic module connecting portions,
    wherein the third photovoltaic module connecting portion secures the third photovoltaic module to the clamping assembly, and
    wherein the fourth photovoltaic module connecting portion secures the fourth photovoltaic module to the clamping assembly.

15. The solar carport of claim 14, wherein the first and second photovoltaic module connecting portions are located on opposite sides of the first connector, and the third and fourth photovoltaic module connecting portions are located on opposite sides of the second connector.

16. The solar carport of claim 14, wherein the first and second connectors are rotatable.

17. The solar carport of claim 14, wherein the first and second connectors are configured to be rotated, from a position on a second side of the beam opposite the first side, to secure the first, second, third, and fourth photovoltaic modules to the clamping assembly.

18. The solar carport of claim 14, wherein rotational orientations of the first and second connectors relative to the upper portion are adjustable from a position on a second side of the beam opposite the first side.

19. The solar carport of claim 12, wherein the fastener includes a bolt passing through a threaded hole in the lower body portion, and wherein a head of the bolt is positioned on a second side of the beam opposite the first side.

20. The solar carport of claim 19, further comprising a torque nut received around the bolt, wherein the head of the bolt has a smaller diameter than the torque nut.

* * * * *